EDWARD L. BONIN
JACK S. KILBY
INVENTORS

BY John D. Graham

ATTORNEY

EDWARD L. BONIN,
JACK S. KILBY
INVENTORS

BY John G. Graham
ATTORNEY

United States Patent Office 3,304,429

Patented Feb. 14, 1967

3,304,429

ELECTRICAL CHOPPER COMPRISING PHOTOSENSITIVE TRANSISTORS AND LIGHT EMISSIVE DIODE

Edward L. Bonin, Richardson, and Jack S. Kilby, Dallas, Tex., assignors to Texas Instruments Incorporated, Dallas, Tex., a corporation of Delaware Filed Nov. 29, 1963, Ser. No. 326,765
15 Claims. (Cl. 250—217)

The present invention relates generally to a transistor chopper. More particularly, it relates to an improved chopper operated in response to optical radiation to provide complete electrical isolation between the driving source and the input and output terminals of the chopper, and is characterized by a very low series impedance between the input and output terminals when the switch is closed, and the ability to switch high level signals.

Transistors are frequently employed as switches in electrical circuits for various applications. When used as such, the switch is closed when the transistor is conducting and is open when it is non-conducting. When the transistor is in a conductive state, it does not act as an ideal short circuit but has an equivalent series resistance and a junction voltage, the latter which limits to a minimum the smallest voltage which can be switched. In order to reduce the junction voltage of a transistor in its conducting state so that smaller voltages may be switched, conventional transistor choppers have been designed such that two transistors are connected in series but in opposite polarities wherein one of the transistors is operated in backward fashion. That is to say, one of the transistors operates with its emitter used as a collector and vice-versa. This implies that the junction voltages, when the transistors are conducting, are in opposite polarities, and the net junction voltage of the two transistors in series is reduced.

Since it is important that the series impedance of the two transistors be very low when the transistors are conducting to approach the ideal switch, the transistors are operated in their saturation mode, which is the conduction mode of lowest impedance. Whether a transistor is operated in the saturation mode is determined by the base-to-collector current gain $h_{FE}$, the applied collector voltage and the base drive. Thus, for a given excitation the lower the gain, the lower the applied collector voltage at which the transistor will pull out of the region of saturation and conduct in a region of high impedance. Therefore, a transistor used in backward fashion in conjunction with another transistor to provide a low off-set voltage for switching applications must have a high reverse current gain to remain in the saturation mode when switching relatively high level signals, or larger voltages. However, it is characteristic of transistors that the reverse current gain normally cannot be made and manufactured as large as the forward $h_{FE}$. It is apparent, therefore, that the conventional choppers utilizing a pair of transistors serially connected in opposite polarities is limited by the fact that the transistor operating in the reverse direction will pull out of saturation before the transistor operating in the forward direction upon the application to the input of the chopper of a relatively high level signal, and that the impedance of the chopper switch will be determined primarliy by the impedance of the reversely operated transistor.

It is highly desirable that the driving source be completely electrically isolated from both the input and output terminals of the chopper. Otherwise, any voltage or noise fluctuation in the driving source will be reflected in the output of the chopper. Even isolation transformers do not provide complete electrical isolation between the driving source and the input and output of the chopper, since magnetic pick-up and spike feed-through due to transformer winding capacitance can occur. Moreover, isolation transformers are very bulky and expensive and, thus, are unsuitable for miniature circuits in addition to being economically unfeasible.

The invention provides a transistor chopper having a very low off-set voltage for low level switching but, in addition, is suitable for higher level switching, the latter being made possible by the maximum series impedance of the switch being at least as small as that of a forwardly conducting transistor. Moreover, the driving source is completely electrically isolated from the input and output of the chopper, which aids in the provision of a circuit suitable for high level switching. The invention comprises a pair of transistors connected in parallel fashion such that when they are conducting, the junction voltages of the two transistors partially or completely cancel each other, thus insuring a low net off-set voltage. Although one transistor is operating in the reverse direction, it is always shunted by a transistor operating in the forward direction, which insures a low switch impedance over a large range of input signals. This is true so long as the emitter-base breakdown voltage is not exceeded for either transistor. The complete electrical isolation of the driving source from the input and output of the chopper is achieved by use of transistors which are photosensitive and which are optically coupled to a solid-state light source to cause them to conduct. The light source generates optical radiation the intensity of which can be modulated at an extremely high frequency, and comprises a semi-conductor junction diode which generates light or optical radiation when a forward current bias is applied to the junction. The light generated has a photon energy greater than the band gap energy of the particular semiconductor material from which the two transistors are fabricated, as will be described hereinafter. For purposes of the present invention, the terms light and optical radiation are used interchangeably and are defined to include electromagnetic radiation in the wavelength region from the near infrared into the visible spectrum. Fast switching is achieved as a result of the fast change of the light intensity. Fast switching action is important in that the junction voltages of the two transistors are not normally matched during the transition between an open and closed state, and vice-versa, which manifests itself as a source of noise at the switch output. Reducing the switching time reduces the duration of mismatch, and, therefore, decreases switching noise. The solid state light source has many other advantages over conventional driving sources, such as, for example, an isolation transformer used for the same purpose, in that the solid-state source is miniature in size and inexpensive in cost.

Other objects, features and advantages will become apparent from the following detailed description when taken in conjunction with the appended claims and the attached drawing in which like reference numerals refer to like parts throughout the several figures, and in which:

Figures 1, 2, 3, 4:
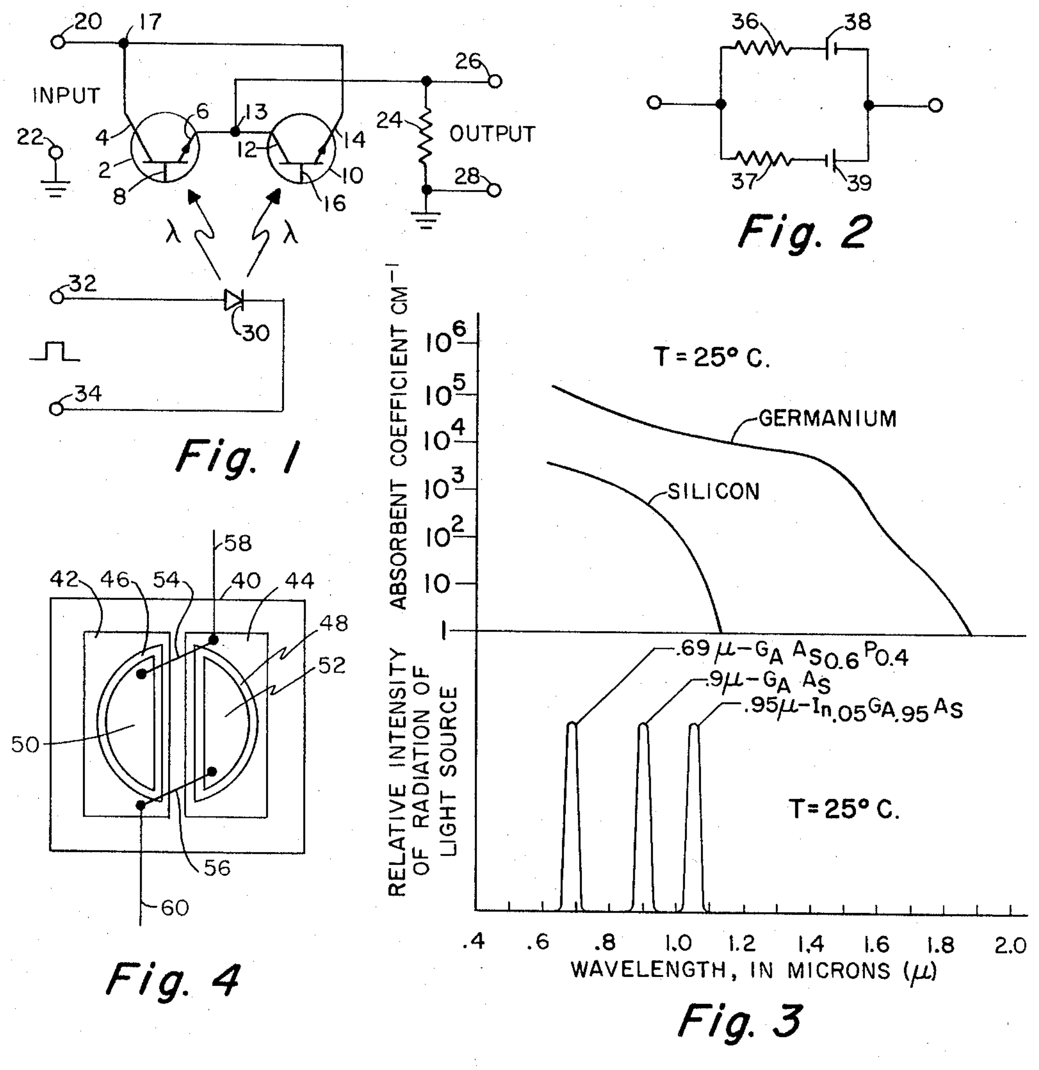
FIGURE 1 is an electrical schematic diagram of the chopper of the invention.
FIGURE 2 is an electrical schematic diagram of the equivalent circuit of the two transistors of FIGURE 1 when they are conducting.
Figure 5:
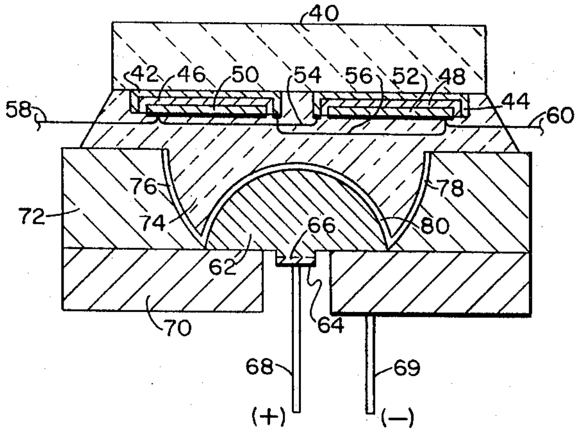
Figure 6:
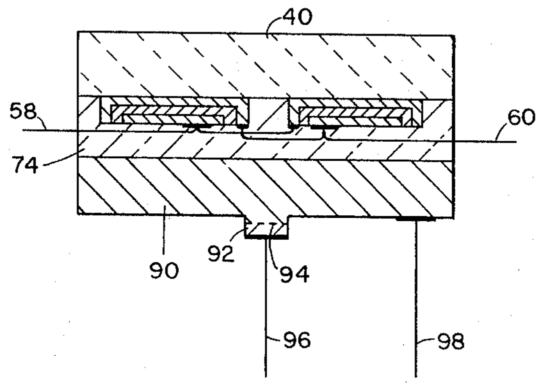

FIGURE 3 are graphical illustrations showing the relative coefficient of absorption of optical radiation as a function of wavelength for the semiconductor materials silicon and germanium as compared to the relative intensity of optical radiation as a function of wavelength for three different light emitting diodes comprised of gallium-arsenide-phosphide ($GaAs_{0.6}P_{0.4}$), gallium-arsenide (GaAs), and indium-gallium-arsenide ($In_{.05}Ga_{.95}As$), respectively;

FIGURE 4 is a plan view of the two transistors used in the embodiment of FIGURE 1;

FIGURE 5 is an elevational view in section of one embodiment of the chopper of the invention; and FIGURE 6 is an elevational view in section of another embodiment of the invention.

An electrical schematic diagram of the transistor chopper system of the invention is shown in FIGURE 1, wherein a first photosensitive transistor 2 is connected in parallel with a second photosensitive transistor 10 with the emitter 6 of transistor 2 connected to the collector 12 of transistor 10, and the collector 4 of transistor 2 connected to the emitter 14 of transistor 10. An electrical input signal to be switched across a load 24 is applied to the interconnection of emitter 14 and collector 4 at the terminal 17 across inputs 20 and 22. The load 24 across which the output is derived is taken across terminals 26 and 28 connected to terminal 13 which is the interconnection of emitter 6 and collector 12. A semiconductor junction diode 30, which emits optical radiation of a characteristic wavelength when a forward current is passed through the junction thereof by means of a signal at its anode 32 and cathode 34, is optically coupled to the two photosensitive transistors so that the radiation of the transistors by the diode causes the two transistors to conduct. It can be readily seen that the diode 30 is completely electrically isolated from the transistors, the input and output of the chopper. This obviates the necessity of a large, expensive isolation transformer which, in the parallel connection as shown, would require two completely separate secondaries for biasing the transistors to conduction. The two transistors can be represented by an equivalent series resistance and junction voltage when conducting, as shown in FIGURE 2, wherein resistance 36 and junction voltage 38 is the equivalent of one of the transistors during conduction. It can also be seen from the equivalent circuit of FIGURE 2 that junction voltages 38 and 39 oppose each other, and for transistors having closely matched or identical characteristics, the net junction or off-set voltage will be very low. Thus, a very small voltage at the input terminals 20 and 22 can be switched across the load 24 without the existence of a large junction voltage superimposed thereon.

The operation of the circuit is as follows. A positive going pulse is applied to the anode terminal 32 with respect to terminal 34 across the junction of the light emitting diode 30, causing optical radiation to be generated by the diode which impinges on the two photosensitive transistors 2 and 10. The light is absorbed in the bulk of the two transistor bodies and creates hole-electron pairs which, if created within a diffusion length of one of the junctions within the transistor, are collected by the junctions, causing it to become forward biased and the transistors to conduct. Sufficient light is generated by the diode 30 to cause each of the transistors to conduct in their saturation mode, which implies a low impedance between the collectors and emitters thereof. Thus, the two transistors act as a switch, and an electrical signal applied across the input terminals 20 and 22 is switched across the load 24 in response to the light. The two transistors are shown to be of the n-p-n variety and, thus, switching of a positive voltage at terminal 20 implies a forward conduction of current through the transistor 2 and a conduction of current through transistor 10 from emitter to collector. Because of the parallel connection of the transistors, the maximum series impedance of the chopper switch will be no greater than the impedance of the transistor having the lowest series impedance.

It is known that for a given current gain, the base drive or base current determines the collector current at which the transistor will pull out of the saturation mode of operation for a particular collector voltage. It is also characteristic of transistors that the forward gain, $h_{FE}$, can be made very large, whereas, the maximum reverse $h_{FE}$ cannot normally be made as large as the forward $h_{FE}$. Analytically, it can be shown that the transistor will pull out of the saturation mode of operation at a lower collector current for a lower $h_{FE}$. Thus, it is readily apparent that transistor 10 operating in the reverse direction wherein the emitter 14 is used as a collector, and the collector 12 is used as an emitter, will pull out of saturation at a lower collector current than will transistor 2. In the conventional chopper system, wherein the transistors are connected in series, this implies that the transistor 10 imposes a high series impedance in the switch for high level signals. However, in the parallel connection the forward current gain of the transistor 2 is very large, say in the order of 50 to 100, and since it shunts transistor 10, the maximum value of the series impedance imposed by the switch is limited to the smaller impedance of transistor 2. Therefore, the circuit as shown in FIGURE 1 is capable of chopping at much higher levels than the conventional chopper so long as the emitter-base breakdown voltage is not exceeded, while yet possessing the advantage of having a very low off-set voltage and low series impedance. That is to say, a much greater current can be passed through the switch while still maintaining the low series impedance of the switch.

To achieve such an operation with conventional electrical connections to the two bases of the transistors and yet maintain any degree of electrical isolation between the driving source and the input and output of the chopper, an isolation transformer having two separate secondaries connected across the respective collectors and bases would be required. The disadvantage of such a driving source is two-fold, namely, the large expense incurred in the provision of such a transformer and its large size, which is incompatible with miniaturized circuits. On the other hand, the light emitting diode 30 and the two photosensitive transistors can be fabricated into a miniature package. Complete electrical isolation between the driving source and the input and output terminals of the chopper is also achieved by use of optical coupling. In addition, the diode light intensity can be modulated at an extremely high frequency to provide fast switching action. By modulating the diode bias current by means of a series of pulses, a high frequency A.C. signal can be developed at the output of the chopper upon the application at the input of a voltage.

A light emitting junction diode comprised of Ga As is described in the co-pending application of Biard et al. entitled Semiconductor Device, Serial No. 215,642, filed August 8, 1962, assigned to the same assignee, and is an example of a suitable solid-state light source such as diode 30 of FIGURE 1. As will be described hereinafter in more detail, the diode can be comprised of other semiconductor materials to produce optical radiation of different wavelengths. As described in the co-pending application, the diode comprises a body of semiconductor material which contains a diffused p-n rectifying junction. A forward current bias, when applied to the junction, causes the migration of holes and electrons across the junction, and recombination of electron-hole pairs results in the generation of optical radiation having a characteristic wavelength or photon energy approximately equal to the band gap energy of the particular semiconductor material from which the diode is fabricated. It will be noted from the above co-pending application that the generation of optical radiation in the diode is caused by a forward current bias at the junction and is an efficient solid-state light source as contrasted to light generated by other mechanisms, such as reverse biasing the junction, avalanche processes, and so forth. The relative intensity of radiation as a function of wavelength for optical radiation generated by a gallium-arsenide p-n junction diode is shown in the lower graph of FIGURE 3, where it can be seen that the radiation intensity is greatest at a wavelength of .9 micron. Typical curves of the absorption coefficients of light as a function of wavelength for silicon and germanium are shown in the upper graph of FIGURE 3, where it can be seen that the .9 micron wavelength radiation generated by a gallium-arsenide diode will be absorbed by a body comprised either of silicon or germanium. Similar curves are shown for light generated by diodes comprised of gallium-arsenide-phosphide $$(GaAs_{0.6}P_{0.4})$$

and indium-gallium-arsenide ($In_{.05}Ga_{.95}As$), where it can again be seen that either germanium or silicon body will absorb the light of wavelengths of .69 micron and 0.95 microns, respectively. These compositions are enumerated as examples only, and other useful compositions will be described below. It will also be noted from the graphs of absorption coefficients that before any appreciable absorption occurs in silicon or germanium, the photon energy must be at least slightly greater than the band gap energies of silicon and germanium, respectively. The band gap energies for silicon and germanium are 1.04 ev. and .63 ev., respectively. The graphs of FIGURE 3 show that absorption begins in silicon at a wavelength of about 1.15 micron, which corresponds to a photon energy of about 1.07 ev., and increases with shorter wavelengths; and absorption begins in germanium at about 1.96 micron, which corresponds to a photon energy of about .64 ev., and increases with shorter wavelengths. These two energies are greater than the respective band gap energies of the two materials, which clearly indicates the band-to-band transitions of electrons upon absorption, which is the type absorption with which the invention is concerned.

Since the optical radiation generated by the diode must be absorbed by the photosensitive transistor switch in such a manner to cause the transistor to conduct, it is important to consider in more detail the absorption phenomenon, which will more clearly illustrate the invention and its advantages. It can be seen from FIGURE 3 that the coefficient of absorption of light is less for longer wavelengths and, therefore, penetrates to a greater depth in a body of semiconductor material before being absorbed than does light of shorter wavelengths. When the light is absorbed in the transistor and generates charge carriers, the carriers, which are holes and electrons, must diffuse to one of the junction regions within the transistor in order to produce a bias to cause the transistor to conduct. In other words, the invention is not concerned with the photoconductive effect within the material of the detector, but a junction effect, wherein the characteristics of the junction are altered when current carriers created by absorption of photons are collected at the junction. Since the transistor conducts on a minority carrier flow within the base region, the light must be absorbed in the transistor within the diffusion length of the minority carriers produced hereby from one or both of the junctions. For longer wavelength light, the junction at which the carriers are collected must be a relatively large depth below the surface of the transistor in order that the majority of the carriers produced by the light be collected. In other words, more depth of material is required before all of the light impinging on the surface of the transistor is absorbed, although a percentage of the light will be absorbed in each successive unit thickness of the transistor. Thus, the region over which the light is absorbed is relatively wide and in order to insure the efficient collection at the junction of the majority of charge carriers generated thereby, relatively high lifetime material is used in the transistor bulk. However, high lifetime material increases the diffusion time of the charge carriers from their point of origination to the junction, therefore decreasing the speed at which the transistor is turned on by the light. Conversely, by using optical radiation of shorter wavelength, the junction depth and lifetime of the semiconductor material can be correspondingly decreased without decreasing the collection efficiency, such as by the use of a light emitting diode comprised of $GaAs_{0.6}P_{0.4}$, for example.

Another factor to be considered is the particular construction of the photo-sensitive transistor. As noted earlier, the lower the offset voltage of the transistor switch, the smaller the signal level that can be switched by the circuit. It is also well known that one way in which the off-set or junction voltage of a transistor can be reduced is by increasing the reverse current gain, $h_{FE}$, which does not affect the forward gain, and also designing the transistor to have a high forward $h_{FE}$, which is well known. As will be described below, the preferred embodiment of the two transistors is an all-diffused device of planar construction where opposite type conductivity determining impurities are diffused into a semiconductor body to form the collector-base and base-emitter junctions. A high reverse $h_{FE}$ is obtained by making the areas of the emitter regions as large as possible with respect to the area of the collector regions.

When the transistors are connected into the chopper circuit as shown in FIGURE 1, it can be shown that when the transistors are made to conduct by a forward bias on the collector-base junctions alone, the net off-set voltage of the chopper circuit is dependent on the degree of mismatch of the forward $h_{FE}$ and the reverse $h_{FE}$ of the two transistors. That is to say, with the same bias applied to both transistors to turn them on, and with the bias being applied only to the collector-base junctions, the respective off-set voltages of the two transistors will be different if the $h_{FE}$ of the two transistors are different. In the structure of the invention as shown in FIGURE 1, light is absorbed in the emitter, base and collector regions of the two transistors which gives the effect of a constant current drive on both the emitter-base and base-collector junctions of the two transistors, rather than a drive on the collector-base junctions alone. Under these conditions, the off-set voltage is dependent on the reverse $h_{FE}$ of each unit, the relative values of the two current generators and the forward current gain of each unit. By adjusting the relative position of the light source, namely, adjusting the relative position of the junction diode light source with respect to the two transistors, the relative values of the two current generators can be changed, and, thus, the off-set voltage may be reduced to an arbitrarily small value.

A preferred embodiment of the two photosensitive transistors is shown in the plan view of FIGURE 4, wherein the two transistors are all-diffused devices of planar construction. Planar construction is desirable in that the devices are characterized by very small leakage currents as will be recognized by those skilled in the art. The two transistors comprise two single crystalline wafers 42 and 44 of semiconductor material, such as silicon or germanium, as examples, mounted in spaced relation on an insulating substrate 40. The two wafers of semiconductor material are of a first conductivity type, and an impurity of the opposite conductivity determining type is diffused into each of the wafers to form base regions 46 and 48, respectively. Impurities that determine the same type as the original semiconductor wafers are diffused into the base region to form emitter regions 50 and 52, as shown. The particular geometries of the bases and emitters of the two transistors are semicircular to coincide with the circular geometry of the light emitting diode 30, as will be described hereinafter. Moreover, the areas of the emitter regions are made as large as possible to achieve a high reverse $h_{FE}$. A wire 54 is used to form a connection between the emitter 50 of the first transistor and the collector 44 of the second. Similarly, a wire 56 is used to form an electrical connection between the emitter 52 of the second transistor and collector 42 of the first. Electrical input and output terminals 58 and 60 are provided to the commonly connected emitter and collector regions, respectively. As noted above, the depths of the collector-base junction and the base-emitter junction are designed for the particular wavelength of light emitted by the junction diode light source.

A side elevational view in section of one embodiment of the invention is shown in FIGURE 5, which comprises a pair of photosensitive transistors of either the n-p-n or p-n-p variety connected in parallel fashion as shown in FIGURE 4, and a semiconductor junction diode optically coupled thereto. There is also shown in FIGURE 5 a suitable structure for mounting the components of the chopper to provide the necessary optical coupling between the switch and the driving source. The light emitting junction diode comprises a hemispherical, semiconductor region 62 of a first conductivity type and a smaller region 64 of an opposite conductivity type contiguous therewith. An electrical connection 68 is made to the region 64 and constitutes the anode of the junction diode, and the flat side of the region 62 is mounted in electrical connection with a metallic plate 70 with the region 64 and lead 68 extending into and through a hole in the plate. An electrical lead 69 is provided to the metallic plate 70 and constitutes the cathode of the diode. The diode is fabricated by any suitable process, such as, for example, by the diffusion process described in the above co-pending application or by an epitaxial process, to be described hereinafter, and contains a p-n rectifying junction at or near the boundary between the regions 62 and 64.

Another plate 72 is mounted about the diode and defines a hemispherical reflector surface 76 about the hemispherical dome 62. The pair of photosensitive transistors as shown in FIGURE 4 are mounted above the hemispherical dome with the two emitters 50 and 52 facing the dome. A light transmitting medium 74 is used to fill the region between the reflector and the dome and for mounting the two transistors above the dome, wherein the light transmitting medium acts as a cement to hold the components together. Ample space is provided between the top of the reflector plate 72 and the two transistors for passing the leads 58 and 60 from the transistors out of the region of the dome without being shorted to either the transistors or the reflector plate. These leads are held in place by the cement-like transmitting medium. When a forward bias current is passed through the junction of the radiant diode between the anode 68 and cathode 69, light is emitted at the junction, travels through the n-type conductivity dome and the light transmitting medium 74 and strikes the surfaces of the two transistors, where it is absorbed in the regions of the emitter-base and base-collector junctions to cause the transistors to conduct.

The hemispherical dome structure is used in order to realize the highest possible quantum efficiency. If the proper ratio of the radius of the junction 66 to the radius of the hemispherical dome is selected, then all of the internally generated light that reaches the surface of the dome has an angle of incidence less than the optical critical angle and can be transmitted. The maximum radius of the diode junction with respect to the dome radius depends on the refractive index of the coupling medium, and since all of the light strikes the dome surface close to the normal, a quarter wavelength anti-reflection coating will almost completely eliminate reflection at the dome surface. The maximum radius of the diode junction to the dome radius is determined by computing the ratio of the index of refraction of the coupling medium to the index of refraction of the dome material. The dome, as shown in FIGURE 5, has a quarter wavelength anti-reflection coating 80 thereon comprised of zinc-sulfide to eliminate any possible reflection. A true hemispherical dome is optimum, because it gives the least bulk absorption of all spherical segments which radiate into a solid angle of $2\pi$ steradians or less. Spherical segments with height greater than their radius radiate into a solid angle less than $2\pi$ steradians, but have higher bulk absorption. Spherical segments with height less than either radius have less absorption but emit into a solid angle greater than $2\pi$ steradians and, therefore, direct a portion of the radiation away from the detector. Due to the presence of bulk absorption, the dome radius should be as small as possible to further increase the quantum efficiency of the unit.

The two photosensitive transistors, taken together, have a radius of about 1.5 times the radius of the hemispherical dome, which allows all the light emitted by the dome to be directed toward the detector by the use of a simple spherical reflecting surface 76. Since most of the light from the hemispherical dome strikes the transistor surface at high angles of incidence, an anti-reflection coating on the detector is not essential and can be considered optional. The light transmitting medium 74 between the dome and the transistors should have an index of refraction high enough with respect to the indices of refraction of the dome and the transistors to reduce internal reflections, and to allow the diode junction radius to the dome radius to be increased. The medium should also "wet" the surfaces of the source and the detector so that there are not voids which would destroy the effectiveness of the coupling medium. The indices of refraction of the diode and the transistors are each about 3.6. A resin, such as Sylgard, which is a trade name of the Dow Corning Corporation of Midland, Michigan, has an index of refraction of about 1.43 and is suitable for use as the light transmitting medium. Although this index is considerably lower than 3.6, it is difficult to find a "transparent" substance that serves this purpose with a higher index. In order to insure the highest reflectivity, the reflector surface 76 is provided with a gold mirror 78 which can be deposited by plating, evaporation, or any other suitable process.

The metallic plates 70 and 72 are preferably comprised of a metal or alloy having the same or similar coefficient of thermal expansion as the junction diode, such as Kovar, for example. Similarly, the coupling medium 74 preferably has the same or similar coefficieent of thermal expansion, or alternately remain pliable over a wide, useful temperature range of normal operation. Again, Sylgard satisfies this requirement by being pliable.

The net off-set voltage is particularly sensitive to the relative position of the junction diode light source and the two silicon transistors. During fabrication of the device of FIGURE 5, the relative positions are adjusted until desired on impedance is obtained for a prescribed minimum value of the net off-set voltage. The adjustment is performed before the optical coupling material 74 has had time to set and become semirigid, and is accomplished by causing the diode to irradiate the transistors while measuring the off-set voltage between terminals 58 and 60. The matched coefficients of thermal expansion of the various components of the system and the pliable nature of the coupling medium prevent misalignment as a result of temperature changes during operation.

Various compositions of the light emitting diode and photosensitive transistor have been mentioned in conjunction with the graphs of FIGURE 3, wherein the preferred compositions depend upon several factors including the absorption coefficient of the photosensitive transistor, the ultimate efficiency to be achieved from the diode, and other factors as will be presently described. One factor to be considered is the speed of response of the photosensitive transistors to the optical radiation, wherein it has been seen that light of shorter wavelength gives a faster switching time because of the greater coefficient of absorption of the detector. This factor, if considered by itself, would indicate that a diode comprised of a material which generates the shortest possible wavelength is preferred. However, the efficiency of the light source must also be considered, in which the overall efficiency can be defined as the ratio of the number of photons of light emerging from the dome to the number of electrons of current to the input of the diode, and the internal efficiency is the ratio of the number of photons of light generated in the diode to the number of input electrons.

It was pointed out in the above co-pending application that, in most cases, less of the light generated internally in the diode is absorbed per unit distance in the n-type region than in the p-type region. Moreover, n-type material can normally be made of higher conductivity than p-type material of the same impurity concentration. Thus, the dome is preferably of n-type conductivity material. In addition to this factor, it has been found that the greater the band gap of the material in which the light is generated, the shorter the wavelength of the light, wherein the frequency of the generated light is about equal to or slightly less than the frequency separation of the band gap. It has further been found that the light is absorbed to some extent in the material in which it is generated or in a material of equal or less band gap width, but is readily transmitted through a material having a band gap width at least slightly greater than the material in which the light is generated. In fact, a sharp distinction is observed between the efficient transmission of light through a composition whose band gap is slightly greater than the composition in which the light is generated, and through a composition having a band gap equal to or less than that of the generating composition. This implies that the light is readily transmitted through a material the frequency separation of the band gap of which is greater than the frequency of the generated light.

To take advantage of this knowledge, the light emitting diode, in the preferred embodiment, is comprised of two different compositions in which the junction at or near which the light is generated is located in a first region of the diode comprised of a material having a first band gap width and of p-type conductivity, and in which at least the major portion of the dome is comprised of a second material having a second band gap width greater than the first material and is of an n-type conductivity. Thus, light generated in the first material has a wavelength which is long enough to be efficiently transmitted through the dome. There are several materials that have been found to be internally efficient light generators when a forward current is passed through a junction located therein, in addition to GaAs noted in the above co-pending application. The material indium-arsenide, InAs, has a band gap width of about .33 ev. and, if a p-n junction is formed therein, will generate light having a wave-length of about 3.8 microns, whereas light from GaAs is about .9 micron. The compositions $In_xGa_{1-x}As$, where $x$ can go from 0 to 1, give off light of wavelength which varies approximately linearly with $x$ between 3.8 microns for InAs when $x=1$ to .9 micron for GaAs when $x=0$. On the other side of GaAs is the composition gallium phosphide, GaP, which has a band gap of about 2.25 ev. and emits radiation of about .5 micron. Also, the compositions $GaAs_xP_{1-x}$, where $x$ can go from 0 to 1, give off light of wavelength which varies approximately linearly with $x$ between .9 micron for GaAs when $x=1$ to .5 micron for GaP when $x=0$. It has been found, however, that for various reasons, the internal efficiency of light generation begins to drop off when the band gap of the material used is as high as about 1.8 ev., which approximately corresponds to the composition $GaAs_{0.6}P_{0.4}$, or for $x$ equal to or less than about 0.4 for the compositions $GaAs_xP_{1-x}$.

Referring again to the FIGURE 5 and more specifically to the construction of the light emitting diode, a preferred embodiment comprises a dome 62 of n-type conductivity material with a smaller region 64 contiguous therewith in which a portion is of p-type conductivity. The region 64 is comprised of a composition having a first band gap width, and the dome 62 is comprised of a region having a second band gap width greater than that of region 64. The rectifying junction 66 is formed in the region 64 of smaller band gap width so that the light generated herein will be efficiently transmitted through the dome. The portion of region 64 between the junction 66 and the dome is of n-type conductivity. Referring to the graphs of FIGURE 3 and the foregoing discussion, a preferred composition for the region 64 is one which will generate as short a wavelength as possible in order to have a high coefficient of absorption in the transistors for fast switching action, and yet which will be efficiently transmitted by the dome 62. At the same time, the composition of region 64 should have a high internal efficiency as a light generator. The composition $GaAs_{0.6}P_{0.4}$ will efficiently produce light of wavelength of about .69 micron and constitutes a preferred material for the smaller region 64. By making the dome of a composition of band gap slightly greater than that of the region 64, such as $GaAs_{0.5}P_{0.5}$, for example, or for $x$ to or less than 0.5 for the compositions $GaAs_xP_{1-x}$, the light will be efficiently transmitted. It should be noted that although the dome is comprised of a composition that does not have a high internal efficiency of light generation, this is unimportant, since the light is actually generated in the smaller region 64 of high efficiency. Thus, the dome material can be extended to compositions of relatively high band gap widths, even to GaP, without decreasing the over-all efficiency of the unit.

Other compositions and combinations thereof can be used, such as various combinations of $In_xGa_{1-x}As$ or $GaAs_xP_{1-x}$, or both. In addition, most III–V compounds can be used, or any other material which generates light by a direct recombination process when a forward current is passed through a rectifying junction therein. Moreover, the entire light emitting diode can be comprised of a single composition such as, for example, GaAs as described in the above co-pending application. It can, therefore, be seen how the compositions of the various components of the system can be varied to achieve various objectives, including the highest over-all efficiency of the entire system. Undoubtedly, other suitable compositions and combinations thereof will occur to those skilled in the art.

The light emitting diode can be made by any suitable process. For example, if two different compositions are used, a body or wafer constituted of a single crystal of one of the compositions can be used as a substrate onto which a single crystal layer of the other composition is deposited by an epitaxial method, which method is well known. Simultaneous with or subsequent to the epitaxial deposition, the rectifying junction can be formed in the proper composition, slightly removed from the boundary between the two, by the diffusion of an impurity that determines the opposite conductivity type of the composition. By etching away most of the composition containing the junction, the small region 64 can be formed. If the entire light emitting diode is comprised of a single composition, a simple diffusion process can be used to form the junction. The shape of the dome is formed by any suitable method, such as, for example, by grinding or polishing the region 62.

Another embodiment of the invention is shown in FIGURE 6, which is an elevational view in section of a planar constructed light emitting diode optically coupled to a double emitter transistor. Two separate transistors as shown in FIGURE 5 are also used in this embodiment. The light emitting diode comprises a wafer 90 of semiconductor material of a first conductivity type into which is diffused an impurity that determines the opposite conductivity type to form a region 92 of said opposite conductivity type separated from the wafer 90 by a rectifying junction 94. The wafer is etched to cut below the junction and form the small region 92. Alternatively, the region 92 can be formed by an epitaxial process. Electrical leads 96 and 98 are connected to the region 92 and wafer 90 as previously described.

The wafer 90 is not formed into a dome structure in this embodiment, but is left in a planar configuration and optically coupled to the detector, as shown, with a suitable coupling medium 74 as noted earlier. This embodiment is more expedient to fabricate, as can be readily seen, and thus is advantageous in this respect. As indicated above, the dome structure is used to realize a high quantum efficiency, since all of the internally generated light strikes the surface of the dome at less than the critical angle, and thus little, if any, light is lost to internal reflections within the dome. This is not necessarily the case in the planar embodiment of FIGURE 6, and in order to achieve a high quantum efficiency, the diameter of the apparent light emitting surface of wafer 90, assuming a circular geometry, can be made somewhat smaller than the combined diameters or lateral dimensions across the two emitters of the detector. The apparent light emitting surface of the diode is determined by the thickness of wafer 90, the area of the light emitting junction 94, and the critical angle for total internal reflection. The critical angle of reflection is determined by computing the arcsine of the ratio of the index of refraction of the coupling medium 74 to the index of refraction of the semiconductor wafer 90.

In the preceding discussions, it was noted that a coupling medium having a suitable index of refraction is preferably used between the light emitting diode and the detector. If such a medium is used, it should have a high index to match, as closely as possible, that of the two components between which it is situated. Materials other than Sylgard can also be used, such as a high index of refraction glass. However, it can prove expedient and desirable in certain cases to couple the two components together with air, where a physical coupling is either impractical or impossible, and such a system is deemed to be within the intention of the present invention.

Although the preferred embodiment of the light emitting diode contains the junction in the region 64 below the boundary between the two regions 62 and 64, the junction can also be formed at this boundary or actually within the dome region 62 should this be more expedient for one or more reasons. In the case where the entire diode is comprised of a single composition, for example, an equally as efficient light emitter can be made by locating the junction other than as shown in the preferred embodiment.

Other modifications, substitutions and alternatives will undoubtedly occur that are deemed to fall within the scope of the present invention, which is intended to be limited only as defined in the appended claims.

What is claimed is:

1. An electro-optical chopper for switching an electrical signal from a first circuit to a second circuit, comprising:

(a) a pair of transistors comprised of a first semiconductor material each having an emitter region, a base region and a collector region with the collector region of one of said pair of transistors interconnected with the emitter region of the other of said pair of transistors, and the collector region of said other of said pair of transistors interconnected with the emitter region of said one of said pair of transistors to effect at least a partial cancellation of the junction voltages as measured between the emitter regions of said pair of transistors when conducting, (b) an input terminal connected to the interconnection of said collector region of said one of said pair of transistors and said emitter region of said other of said pair of transistors for connection into said first circuit and for the application of said electrical signal thereto, (c) an output terminal connected to the interconnection of said collector region of said other of said pair of transistors and said emitter region of said one of said pair of transistors for connection into said second circuit, (d) said pair of transistors conducting in response to optical radiation incident thereon which has a photon energy greater than the band gap energy of said first semiconductor material, and (e) a semiconductor light emitting device for generating optical radiation having a photon energy greater than the band gap energy of said first semiconductor material electrically isolated from but optically coupled to said pair of transistors for directing said optical radiation thereon, (f) said light emitting device having a first region of one conductivity type and a second region of an opposite conductivity type contiguous to and forming a rectifying junction with said first region and generating said optical radiation when a current is caused to flow through said junction in a forward direction.

2. An electro-optical chopper according to claim 1 wherein said rectifying junction of said light emitting device is located within a second semiconductor material which has a band gap energy greater than that of said first semiconductor material.

3. An electro-optical chopper according to claim 1 wherein at least a portion of said optical radiation is absorbed in said pair of transistors within a minority carrier diffusion length from the collector-base junctions thereof.

4. An electro-optical chopper according to claim 1 wherein said first region and a portion of said second region of said light emitting device are comprised of a second semiconductor material, and the rest of said second region is comprised of a third semiconductor material.

5. An electro-optical chopper according to claim 1 wherein a substantially external surface of each of said emitter regions of said pair of transistors lies substantially in a single, common plane which faces said light emitting device.

6. An electro-optical chopper according to claim 5 wherein a major portion of each of the rectifying junctions of said pair of transistors is substantially parallel to said common plane.

7. An electro-optical chopper according to claim 5 wherein said rectifying junction of said light emitting device is substantially parallel to said common plane with said first region and a portion of said second region being comprised of a second semiconductor material, and the rest of said second region being comprised of a third semiconductor material, said second region being disposed between said first region and said common plane.

8. An electro-optical chopper according to claim 7 wherein said second semiconductor material has a band gap energy greater than that of said first semiconductor material, and said third semiconductor material has a band gap energy greater than that of said second semiconductor material.

9. An electro-optical chopper according to claim 8 wherein a major portion of each of the rectifying junctions of said pair of transistors is substantially parallel to said common plane.

10. An electro-optical chopper according to claim 9 wherein said major portions of said each of said rectifying junctions of said pair of transistors is disposed beneath said external surfaces of each of said emitter regions distances such that at least a portion of said optical radiation is absorbed in said pair of transistors with a minority carrier diffusion length from the rectifying junctions therein.

11. An electro-optical chopper according to claim 5 wherein said rectifying junction of said light emitting device is substantially parallel to said common plane with said second region being disposed between said first region and said common plane.

12. An electro-optical chopper according to claim 11 wherein said second region defines a hemispherical surface facing said pair of transistors with said rectifying junction of said light emitting device being substantially parallel to the base thereof.

13. An electro-optical chopper according to claim 12 including reflecting surfaces disposed laterally about said hemispherical surface for directing said optical radiation on said emitter regions of said pair of transistors.

14. An electro-optical chopper according to claim 11 wherein said second region defines a planar surface facing said pair of transistors.

15. An electro-optical chopper according to claim 2 wherein said first semiconductor material is selected from the group consisting of silicon and germanium, and said second semiconductor material is selected from the group consisting of compounds of elements of Groups III and V of the Periodic Table.

References Cited by the Examiner

UNITED STATES PATENTS

| | | | |
|---|---|---|---|
| 2,728,857 | 12/1955 | Sziklai | 307—88.5 |
| 2,779,877 | 1/1957 | Lehovec | 250—211 |
| 2,891,171 | 6/1959 | Shockley | 307—88.5 |
| 3,043,958 | 7/1962 | Diemer | 250—211 |
| 3,229,104 | 1/1966 | Rutz | 250—211 |

OTHER REFERENCES

Gilleo et al.: Electronics, November 22, 1963, pp. 23–27.

Wolff: Electronics, June 21, 1963, pp. 24, 25.

Wolff: Electronics, June 28, 1963, pp. 32–34.

RALPH G. NILSON, *Primary Examiner.*

WALTER STOLWEIN, *Examiner.*